United States Patent [19]

Dickol et al.

[11] Patent Number: 5,376,849
[45] Date of Patent: Dec. 27, 1994

[54] HIGH RESOLUTION PROGRAMMABLE PULSE GENERATOR EMPLOYING CONTROLLABLE DELAY

[75] Inventors: John E. Dickol, Poughkeepsie, N.Y.; Dinh L. Do, San Jose, Calif.; Algirdas J. Gruodis, Wappingers Falls, N.Y.

[73] Assignee: International Business Machines Corporation, Armonk, N.Y.

[21] Appl. No.: 985,405

[22] Filed: Dec. 4, 1992

[51] Int. Cl.$^5$ .................................................. H03K 3/86
[52] U.S. Cl. ....................................... 327/278; 327/276; 327/291
[58] Field of Search ............... 307/603, 602, 606, 595, 307/597, 269; 328/66, 55; 377/76

[56] References Cited

U.S. PATENT DOCUMENTS

| | | | |
|---|---|---|---|
| 4,398,085 | 8/1983 | Benedict | 377/20 |
| 4,593,205 | 6/1986 | Bass et al. | 307/269 |
| 4,608,706 | 8/1986 | Chang et al. | 377/39 |
| 4,611,136 | 9/1986 | Fujie | 307/603 |
| 4,682,327 | 7/1987 | Okumura et al. | 370/100 |
| 4,714,924 | 12/1987 | Ketzler | 307/602 |
| 4,717,843 | 1/1988 | Yoshimura | 307/455 |
| 4,795,923 | 1/1989 | Dobos | 307/605 |
| 4,866,314 | 9/1989 | Traa | 307/603 |
| 4,893,936 | 1/1990 | Hester et al. | 307/603 |
| 4,894,791 | 1/1990 | Jiang et al. | 328/55 |
| 5,013,944 | 5/1991 | Fischer et al. | 328/66 |
| 5,063,311 | 11/1992 | Swapp | 307/603 |
| 5,101,177 | 3/1992 | Johnson et al. | 307/262 |
| 5,144,174 | 9/1992 | Murakami | 328/55 |
| 5,214,680 | 5/1993 | Gutierrez, Jr. et al. | 307/603 |
| 5,280,195 | 1/1994 | Goto et al. | 302/269 |

OTHER PUBLICATIONS

"ELC IC integrates 200-MHz ATE pin electronics", EDN, May 21, 1992, p. 19.
"High accuracy ASIC testers", by Dr. T. Tamama, Electronic Product Design, Oct. 1990, pp. 39–42.
"200 MHz Timing System" by Y. E. Chang and C. E. Morgan, IBM Technical Disclosure Bulletin, vol. 20, No. 3, Aug. 1977, pp. 1027–1028.

Primary Examiner—Timothy P. Callahan
Assistant Examiner—Dinh Le
Attorney, Agent, or Firm—H. Daniel Schnurmann

[57] ABSTRACT

A programmable pulse generator that uses high resolution programmable delay circuits (HRPDCs) as building blocks, each of which is capable of changing timing "on-the-fly", i.e., modifying the programmable delay within one tester cycle and without the limitations of existing delay circuits. The pulse generator comprises a timing control array that is subdivided into three components providing coarse delay, fine delay and extra-fine delay; a plurality of timing generators respectively controlled by the timing control array, each generator further comprising a plurality of HRPDCs, programmable delay circuits, and fixed delay blocks appropriately combined to modify pulse delay and pulse edges within each cycle.

17 Claims, 9 Drawing Sheets

| ARRAY WORD | Set 1 | Reset 1 | Set 2 | Reset 2 | Label |
|---|---|---|---|---|---|
| 1 | OFF | OFF | OFF | OFF | NOP |
| 2 | 0 | OFF | OFF | OFF | NRZ1 0ns |
| 3 | OFF | 0 | OFF | OFF | NRZ0 0ns |
| 4 | 1 | OFF | OFF | OFF | NRZ1 1ns |
| 5 | OFF | 1 | OFF | OFF | NRZ0 1ns |
| 6 | 1.5 | 0.5 | OFF | OFF | R1 |
| 7 | 0 | 1 | 2 | 3 | Dbl Pls |
| 8 | 2.0 | 1.0 | OFF | OFF | R1 |
| 9 | 0 | 1.6 | OFF | OFF | Rz 1.6 |
| 10 | 0 | 1.8 | OFF | OFF | Rz 1.8 |
| 11 | 0 | 2.0 | OFF | OFF | Rz 2.0 |
| 12 | 0 | 2.2 | OFF | OFF | Rz 2.2 |
| 13 | 0 | 2.4 | OFF | OFF | Rz 2.4 |
| 14 | 0 | 2.6 | OFF | OFF | Rz 2.6 |
| 15 | 0 | 2.8 | OFF | OFF | Rz 2.8 |
| 16 | 0 | 3.0 | OFF | OFF | Rz 3.0 |

TABLE I

HIGH RESOLUTION PROGRAMMABLE PULSE GENERATOR EMPLOYING CONTROLLABLE DELAY

FIELD OF THE INVENTION

The present invention is related generally to a high resolution programmable delay circuit and more particularly to a programmable pulse generator.

BACKGROUND OF THE INVENTION

Programmable delay circuits are well known in the art. These circuits have been extensively used in a variety of applications, mainly in the field of testing Very Large Scale Integrated circuits (VLSI). Typically, test systems have been known to require the generation of accurate timing signals for use as stimulus for a Device Under Test (DUT), oftentimes with delay increments ranging from a few picoseconds (ps) to several microseconds (us).

Various digital techniques have been proposed to generate relatively large delay steps, usually in the range of 2 and more nanoseconds (ns).

Y. E. Chang et al disclose a programmable timing generator capable of operating at frequencies of up to approximately 200 MHz in the IBM Technical Disclosure Bulletin, Vol. 20, No. 3, August 1977, p. 1027. This circuit has a cycle time which is continuously programmable from 5 to 2,500 ns with the time delay for a particular sequence of pulses being programmable from 0 to that cycle time.

Y. E. Chang et al further describe in U.S. Pat. No. 4,608,706 a high-speed programmable timing generator that uses a digital counter and comparator to generate delays in cycle time increments. Digital counters and comparators have typically been used by practitioners in the art to obtain variable timings for a variety of applications.

A second requirement of future test systems is the ability of changing "timing-on-the-fly", which is defined as allowing programmed delay values to change from one tester cycle to the next. With existing current minimum tester cycle times in the order of 2-4 ns, it is essential that a delay generator circuit be capable of responding to changes in the programmed value at this rate. Existing delay circuits cannot respond this fast, requiring clumsy arrangements of multiplexer circuits and the like, to select from a set of fixed delay generators.

This requirement can be met only by adding substantial number of circuits that include timing memories, counters and verniers that directly interface with a tester driver/load/comparator and which, in combination, generate programmable timing events with resolutions in the range of 10 ps. Such a circuit arrangement, described in the EDN issue of May 21, 1992, under the title of "ECL IC integrates 200 MHz ATE pin electronics", permits selecting a plurality of time sets "on-the-fly", thereby allowing timing to be changed cycle-by-cycle.

In another circuit arrangement described in the October 1990 issue of Electronic Product Design, an article entitled "High accuracy ASIC tester" by Dr. T. Tamama, pp. 39-42, shows a series of cascaded selectors (or demultiplexers) and corresponding parallel paths. Each delay path has a different value that requires extreme care during the design to ensure linearity.

Prior art circuits of this type suffer major drawbacks in their inability or at best, in their difficulty, of switching delay on-the-fly, particularly, in a high-frequency delay environment.

OBJECT OF THE INVENTION

Accordingly, it is an object of the invention to generate delay increments of a magnitude much less than that of a single logic gate, preferably in the order of 10 ps or less.

It is another object to provide a circuit with high resolution programmable delay.

It is still another object to provide a timing circuit capable of changing delay values from one cycle to the next, i.e., "timing-on-the-fly".

It is still a more particular object to combine a plurality of high resolution programmable delay circuits in a compounded high resolution programmable delay circuit to vary the total delay to any predetermined value.

It is yet another object to combine a plurality of the previously described circuits into a programmable pulse generator, providing accurate timing signals and capable of changing pulse timing parameters from one cycle to the next.

It is a more particular object to minimize the amount of time and effort required for calibrating a test system by designing pulse generation circuitry with simplified calibration requirements.

SUMMARY OF THE INVENTION

The present invention is a programmable pulse generator for providing a linear, high resolution delay over a wide range of delays, for providing delay overlap, and for shaping an output pulse with edges of predefined shape, comprising:

a timing control array having a plurality of inputs and outputs, each input is connected to a respective data line for selecting a predetermined delay to be generated, the array having address lines for determining an address;

N timing generators, each having a clock input driven by clocking means, a plurality of control input lines connected to the outputs of the timing control array and an output to provide a signal which is delayed with respect to the clock input signal; and a data formatter having N inputs and an output, wherein each of the inputs is respectively driven by one of the N timing generators outputs, and wherein each of the inputs controls the position of a signal's rising or falling edge at the output, the data formatter combines signals at the N inputs into pulses having rising and falling edges that are delayed with respect to the input clock signal.

BRIEF DESCRIPTION OF THE DRAWINGS

The above and other objects, features and advantages of the present invention will be better understood from the following detailed description taken in conjunction with the accompanying drawings.

TABLE I shows the content of the timing control array for producing selected output.

DETAILED DESCRIPTION OF THE INVENTION

Figure 1:
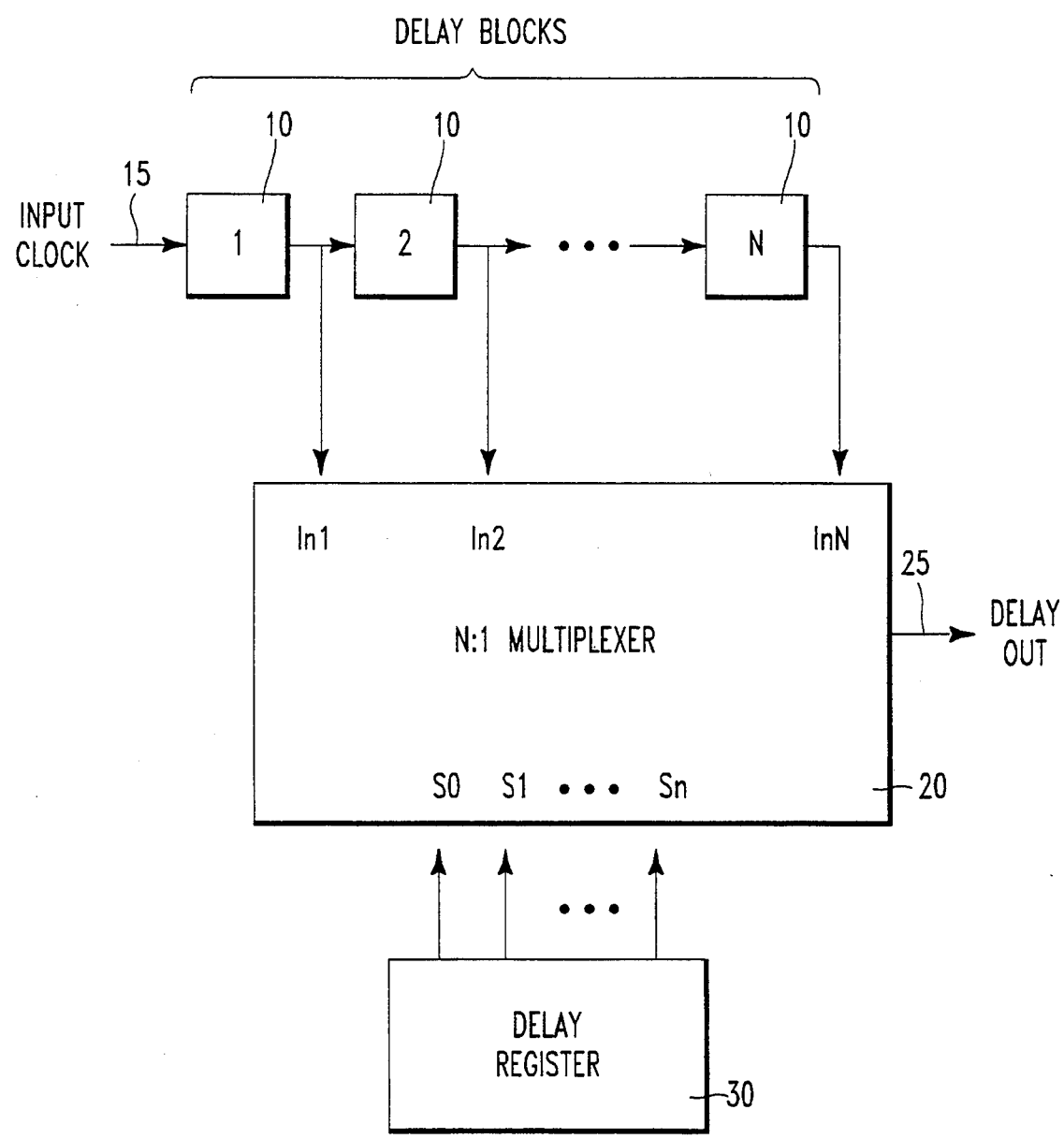
FIG. 1 is a schematic block diagram of a prior art programmable delay circuit.

FIG. 1 shows a schematic diagram of a state of the art programmable delay circuit. A plurality of gates or delay blocks 10 are connected in series to each other. A clock provides an input signal to the first delay block 10 via input line 15. The output of each delay block is attached to an N:1 multiplexer 20 which is provided with an output line 25. Multiplexer 20 is, in turn, controlled by a delay register 30.

This and other similar state of the art circuits have a major drawback of placing the multiplexer after the chain of delay blocks which complicates the ability of the circuit of changing timing-on-the-fly. With this arrangement, if one wishes to avoid losing any pulses, it becomes necessary for the output pulse from the multiplexer 20 to exit before one may change the delay select bits. This requirement holds particularly true if the total length of the delay chain is longer than the cycle time at which the delays must change.

Figure 2:
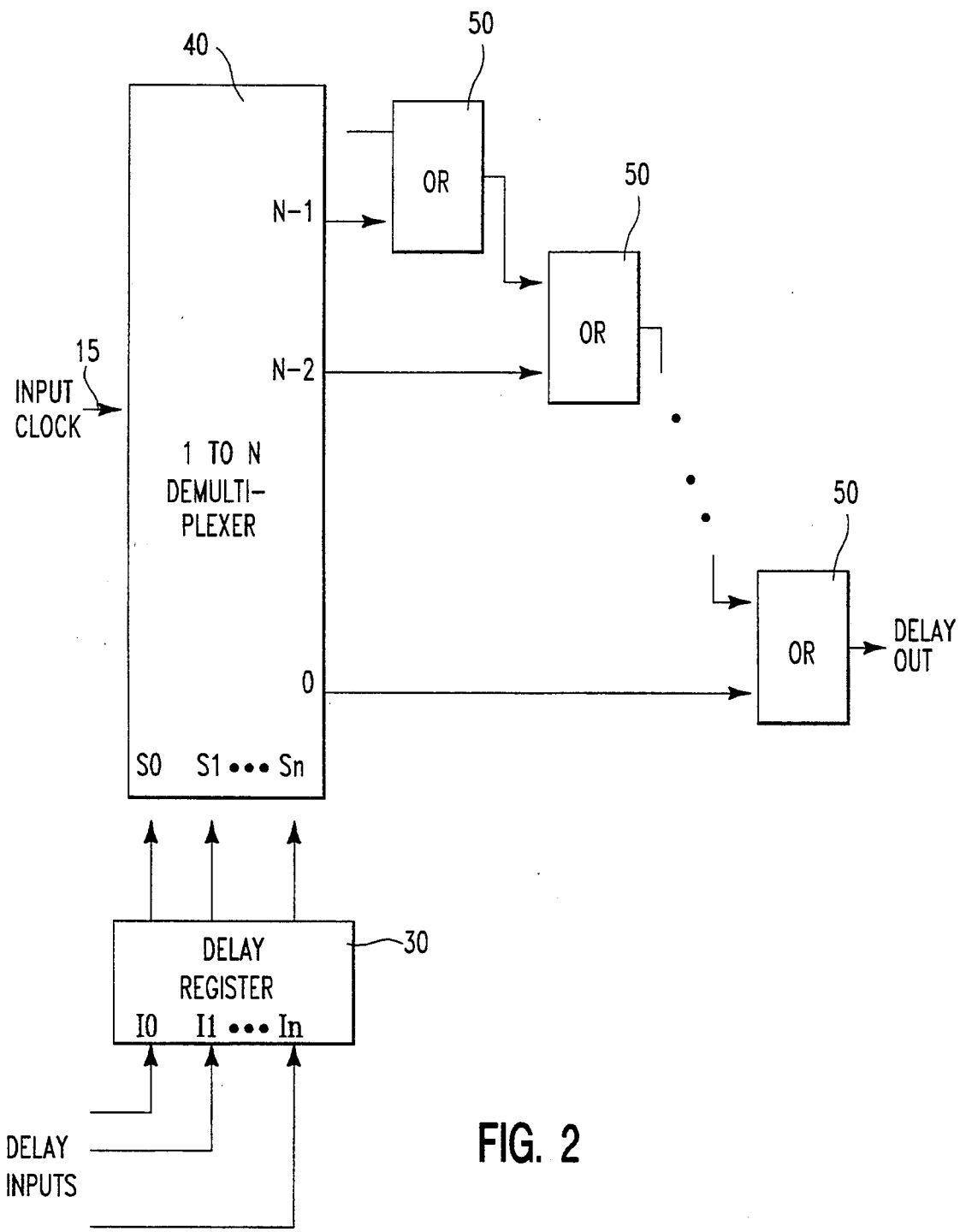
FIG. 2 shows a schematic block diagram of the programmable delay circuit, according to a first preferred embodiment of the present invention.

Referring now to FIG. 2, a schematic diagram of a programmable delay circuit according to the present invention is shown. The circuit is comprised of a chain of identical or nearly identical OR gates 50 connected to each other, with each gate provided with two inputs and one output. The first input of each OR gate 50 is connected to the output of the previous stage and the second of the two inputs is driven by the demultiplexer 40 which, in turn, is driven by a clock signal provided by the input line 15. Delay register 30 is loaded with a predetermined delay defined by the user through its inputs $I_0, \ldots, I_n$ and drives the demultiplexer 40 which steers the input clock through one or more OR blocks 50 under the control of Select bits. A '1' pulse of the clock input 15 appears at the selected demultiplexer output, whereas all other (unselected) demultiplexer outputs remain at '0' level. By way of example, assuming that the demultiplexer 40 is a 1 to 16 (4-bit) circuit. Selecting the binary combination '0000' causes the clock to pass through one OR gate, '0001' to pass through two OR gates, etc. Thus, if all OR gates have the same delay, the total delay is given by:

$$t_{total} = t_{fixed} \times (S+1) \, t_{block},$$

wherein:

$t_{fixed}$ is the fixed bulk delay of the demultiplexer 40, wherein this fixed delay is assumed to be equal for each demultiplexer path;

$t_{block}$ is the delay of one OR gate; and

S is the value of the binary number formed by the demultiplexer Select bits $S_0, S_1, \ldots, S_n$, with $S_0$ being the least significant bit. Thus:

$$S = \sum_{i=0}^{n} S_i \times 2^i.$$

Since the input clock signal always passes through at least one OR block, it is advantageous to combine this value with the fixed delay to produce the total delay:

$$t_{total} = t_{fixed}' + t_{block} \times S,$$

wherein:

$$t_{fixed}' = t_{fixed} + t_{block}.$$

Practitioners of the art will fully appreciate that block delay varies from chip to chip due to process variations. This is not a problem as long as this delay can be measured and compensated for—a fact that has been confirmed by simulation runs. Furthermore, it is important that this delay be a linear function of the input Select bits S. If it is linear, then by making two delay measurements for two values of S, one may calculate $t_{fixed}'$ and $t_{block}$ to be used for this circuit. Once $t_{fixed}'$ and $t_{block}$ are known, then:

$$S = (desired\ delay - t_{fixed}')/t_{block}$$

or:

$$S = gain \times desired\ delay + offset,$$

wherein:

gain $= 1/t_{block}$ and offset $= -t_{fixed}'/t_{block}$.

Alternatively, the circuit shown in FIG. 2 could have been implemented with AND gates if the outputs of demultiplexer 40 would have been inverted. In such instance, the unselected outputs would have been at '1', thereby allowing a '0' pulse at the clock input 15 to propagate through a programmable number of AND blocks.

Putting the demultiplexer 40 before the delay chain allows the delay control bits to change as soon as the clock signal leaves the demultiplexer and enters the delay chain. One is not required to wait for a previous pulse to exit the entire delay circuit before injecting a second pulse, thereby allowing more than one pulse to be present in the chain at a given time. Indeed, it is even possible for a pulse injected during one cycle to exit the delay circuit before a pulse injected during a previous cycle. By way of example, considering a tester with a 4 ns cycle time, on the first cycle the delay bit is set at a large value, e.g., 8 ns. The delay of the second cycle is set at a small value, e.g., at 1 ns. The "first" pulse is outputted at 8 ns, whereas the "second" pulse exits after:

$$one\ cycle + programmed\ delay = 4 + 1 = 5\ ns,$$

i.e., before the "first" pulse. This eliminates the possibility of creating "dead zones" at the start and stop of each test cycle and allows considerable flexibility in programming test vector times.

The circuit described in FIG. 2 can generate delays of a magnitude larger than that of a single gate. However, it does not allow for very fine delays, particularly for those that are much smaller than the propagation delay of a single gate. In order to solve this problem, a high resolution programmable delay circuit (HRPDC), shown in FIG. 3, allows the programming of delays as small as 10 ps. Preferably, two current switch emitter follower inverter circuits (CSEF) 100 are connected to each other in series. A third circuit, henceforth referred to as loading block 150, similar to CSEF 100 but without the emitter follower output stage, is connected to the output 115 of the first CSEF stage. The delay through the two CSEF circuits 100 can be changed by varying the logic (i.e., binary) value at the control input 125 of loading block 150. A rising edge at the input IN (105) of the first CSEF 100, which in turn becomes a falling edge at the line 115 connecting the two CSEFs, is delayed by a few ps. when the control input 125 is at a high state.

When the control 125 is high, the common emitter 152 of loading block 150 is likewise high, since control 125 is the most positive voltage of the three current switch transistor inputs (102, 115 and 125). The base emitter voltage $V_{BE}$ of transistor 151 is forced to change since the emitter 152 is at a fixed voltage level while the base 115 is changing. This voltage transition requires a finite amount of time due to the charging of the base-emitter capacitance.

When control 125 is at a low, line 115 is the most positive voltage of the three current switch transistor inputs (102, 115 and 125), so that the common emitter point 152 is free to track the input 115. Since there is no change in $V_{BE}$ and no capacitance requires recharging, the falling edge at 115 can drop somewhat faster, resulting in less delay in the path connecting IN 105 and OUT 135. Once input 115 falls below $V_R$ (at node 102), $V_R$ becomes the most positive voltage input to the current switch, thereby causing the emitter voltage to be fixed. This, in turn, causes the input transistor $V_{BE}$ to change, slowing the rate at which the voltage at 115 falls. By the time that this happens, the input to the second CSEF inverter 100 has already crossed the threshold voltage $V_R$ causing output 135 to switch so that there is no additional delay.

Figure 3:
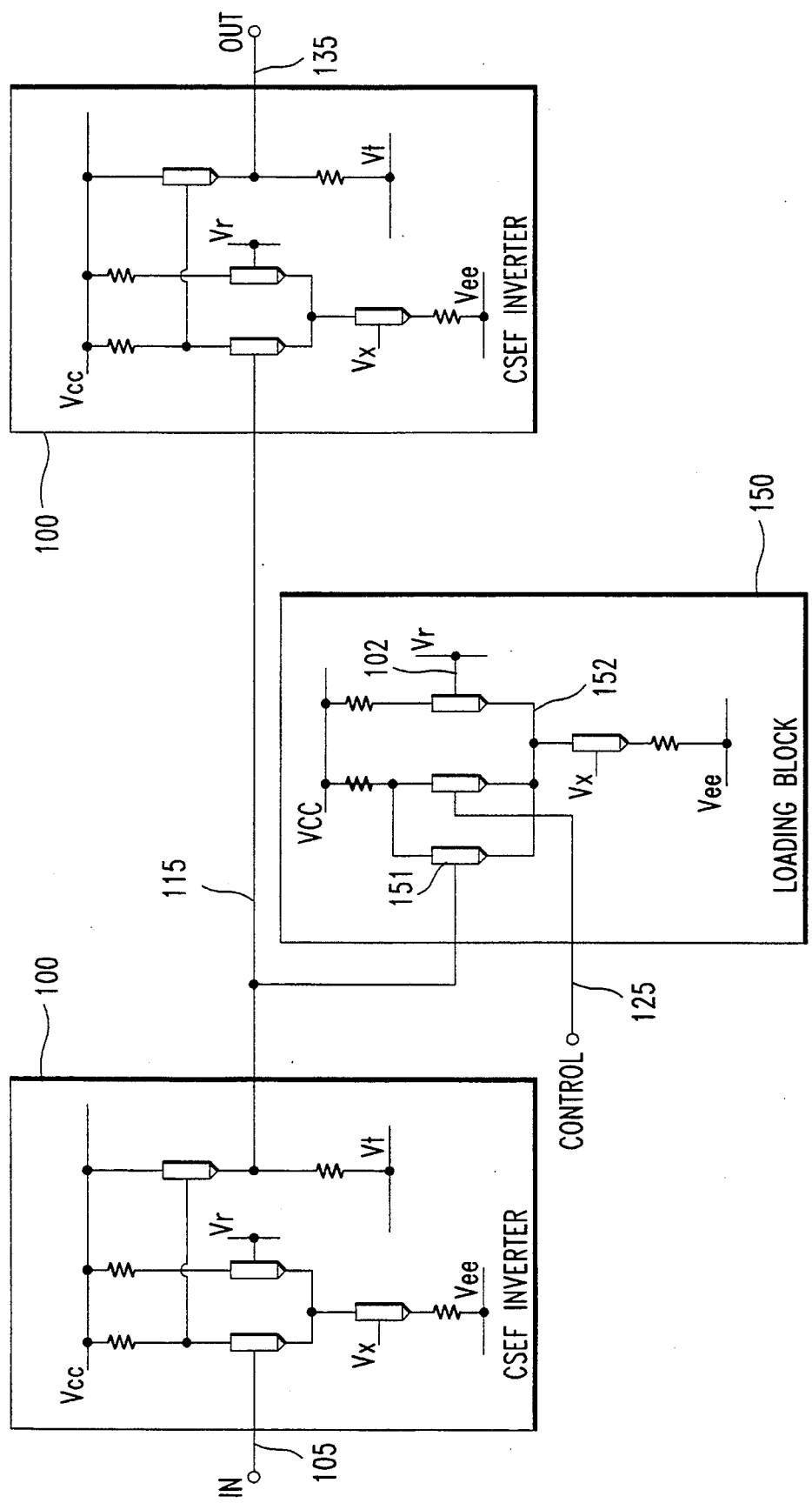
FIG. 3 is a schematic diagram of a high resolution programmable delay circuit (HRPDC), wherein standard logic gates are used to create a relative delay of only a few ps.

The relative delay of the HRPDC shown in FIG. 3 can be increased by using a loading block 150 provided with more than one input. Two factors contribute to the added delay:

a) the additional input transistors introduce extra capacitance, and
b) less emitter current is available to discharge each individual base-emitter capacitance since the current is equally divided among the input transistors.

Since the delay can be controlled by the logic state of loading block 150, the speed by which the delay can be changed is limited by the speed by which the loading block can be switched from one state to the other. This time is typically only a few hundred ps, which makes this circuit well suited for applications that require changing delay on-the-fly.

Figure 4:
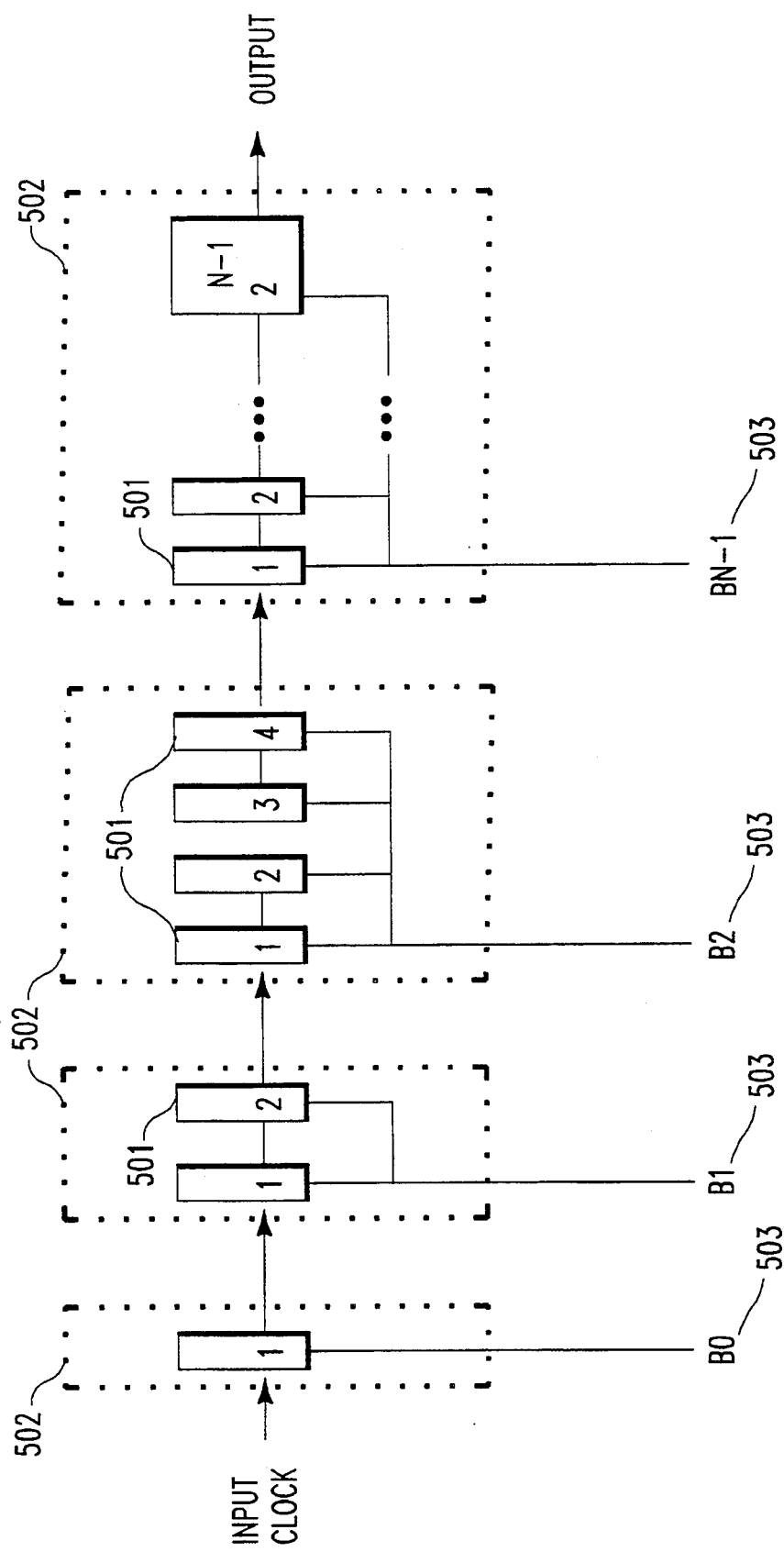
FIG. 4 is a schematic diagram of a programmable delay structure according to the invention, wherein each block represents one HRPDC described in FIG. 3.

In order to achieve delays ranging from a few ps to those of the order of a single logic gate (i.e., 100–200 ps), one may use the programmable delay structure illustrated in FIG. 4. A plurality of HRPDCs 501 are connected to each other in series. A compounded HRPDC (502) is formed by connecting the control inputs of each HRPDC within the same compounded HRPDC to form a compounded control input 503. The first compounded HRPDC 502 is comprised of one HRPDC that is controlled by Bit 0 ($B_0$). The second compounded HRPDC is comprised of two HRPDCs which is controlled by Bit 1 ($B_1$); ... ; and, finally, the $N^{th}$ compounded HRPDC is in turn comprised of $2^{N-1}$ HRPDCs, which is controlled by Bit N−1, wherein N is a positive integer ranging from 1 to the number of compounded HRPDCs. If each HRPDC has the same relative delay value, then the total delay through the circuit is:

$$t_{total} = t_{fixed} + D \times t_{HRPDC},$$

in which:

$t_{total}$ is the delay through the structure,
$t_{fixed}$ is the minimum delay through all the HRPDCs, and
$t_{HRPDC}$ is the relative delay of one HRPDC, defined as the difference in delay from IN (line 105, FIG. 3) to OUT (line 135, FIG. 3) resulting from the different logic levels on control input 125; and
D is the value of the binary number formed by delay bits $B_0, B_1, \ldots$, wherein $B_0$ is the least significant bit. Thus:

$$D = \sum_{i=0}^{N-1} B_i \times 2^i$$

An alternate embodiment of the HRPDC eliminates the second CSEF inverter and uses instead a simple non-inverting CSEF circuit. This alternate circuit uses fewer gates to achieve a given delay range, but it is more prone to pulse width distortions when many HRPDCs are connected in series. These distortions are caused by the "pulse shrinking effect" which is common to a long chain of OR-gates and which is well known to those skilled in the art.

Figure 5:
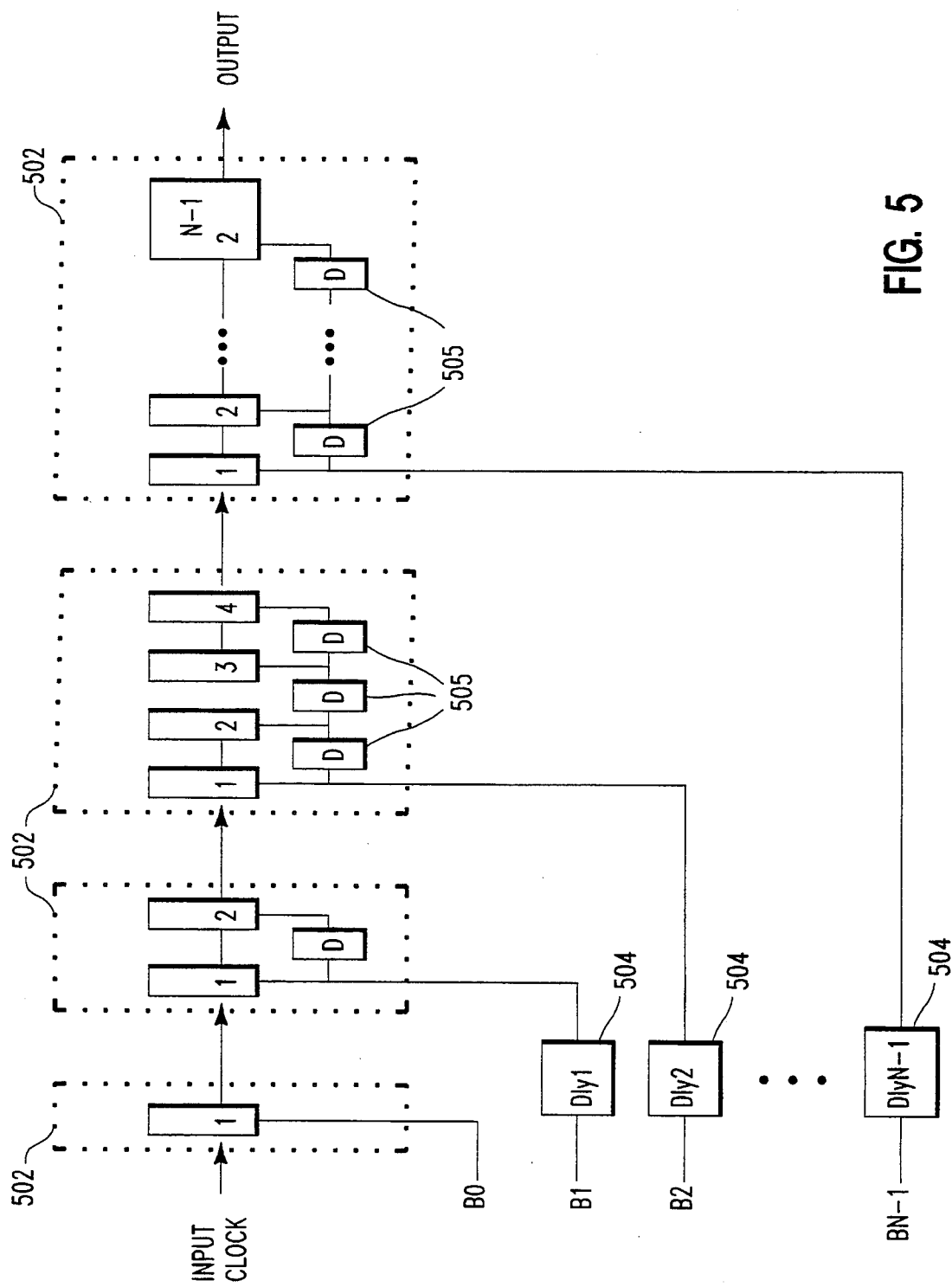
FIG. 5 illustrates a schematic block diagram of a complete programmable delay structure with delayed control bits, wherein control bits are delayed to compensate for the fixed delay through each delay block, thereby permitting timing-on-the-fly changes at a faster rate.

FIG. 5 shows a complete programmable delay structure with delayed control bits. The control bits are delayed with respect to each other to compensate for the fixed delay through each HRPDC, thereby permitting timing-on-the-fly at a faster rate. The delay of each delay block D 505 is equal to the fixed delay of each HRPDC ($t_D$) which, in turn, is comprised of two gate delays. The total number of delay blocks D in the $N^{th}$ compounded HRPDC is $2^{N-1}-1$, wherein N is a positive integer that ranges from 1 to the number of compounded HRPDCs. Dly blocks 504, shown as $Dly_1$, $Dly_2, \ldots, Dly_{N-1}$ compensate for the delay of preceding stages (i.e., $Dly_1 = 1 \times t_D$, $Dly_2 = 3 \times t_D$, etc.). Thus, one may increase the effective delay toggle frequency by adding delay to the control bits for the higher valued bits. This delay, in turn, compensates for the fixed delay introduced by the two CSEF inverters in each HRPDC. Alternatively, the Dly 504 delays compensate for the fixed delay of the compounded HRPDC 502 before the m-th stage, whereas D delays are used to compensate for the fixed delays in the m-th compounded HRPDC 502. If $t_D$ is the fixed delay of a single stage (e.g., two inverter delays), then the m-th delay is given by:

$$Dly_m = \sum_{i=0}^{m-1} t_D \times 2^i = t_D \times (2^m - 1)$$

wherein m is a positive integer ranging from 1 to N−1 (i.e., the number of delay blocks Dly).

The delay control bits can be changed as soon as the signal to be delayed is launched into the delay network. The signal and the control bits will propagate through the network at the same rate. Each control bit delay can be adjusted to arrive at its corresponding delay block just prior to the signal itself.

Practitioners of the art will readily appreciate that the delay produced by the delay blocks will vary from chip to chip due to process variations. As long as this delay can be measured and compensated for, this is not a problem. It becomes even less of a problem if all the delay elements on the same chip have the same delay. What matters is that the delay be a linear function of the input bits. If this is indeed the case, a simple two points measurement can be taken to calculate the gain and offset coefficients of the circuit. If these are known, then the value of the B control bits N for any desired delay is:

$N = gain \times desired\ delay + offset.$

Figure 6:
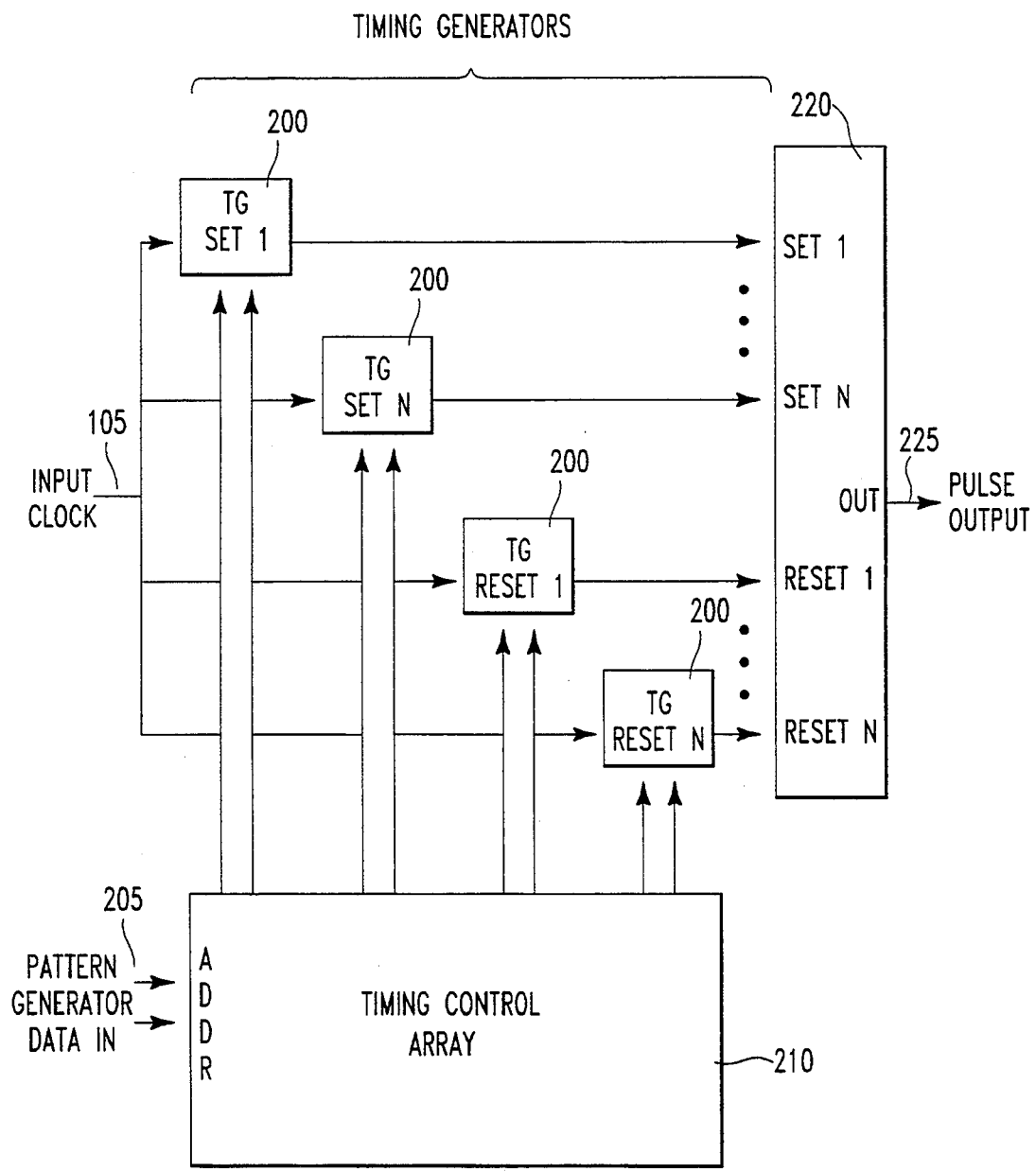
FIG. 6 shows a simplified schematic block diagram of the programmable pulse generator in accordance with the present invention.

Referring to FIG. 6, a simplified block diagram of the programmable pulse generator in accordance with the present invention is shown which utilizes the delay circuits previously referred to.

The programmable pulse generator is comprised of a plurality of timing generators 200, each capable of placing a clock pulse anywhere within a given cycle. Additionally, it also suppresses the generation of a pulse in the course of any cycle. Timing generators 200 are driven by a timing control array 210 which selects the desired delay values for each generator 200. Data from a test pattern generator (via input lines 205) is used to generate an address for the timing control array 210. This array is pre-loaded with the desired timing sets. At the beginning of each tester cycle, an address is supplied to array 210 to select the desired timing set for that cycle. The outputs of timing generators 200 feed into a data formatter 220 which uses delay timing generator clocks (not shown) to produce rising and falling edges of the output pulse (at line 225). Thus, the data formatter in combination with the timing generators create an output pulse with the desired edge timings.

Figure 7:
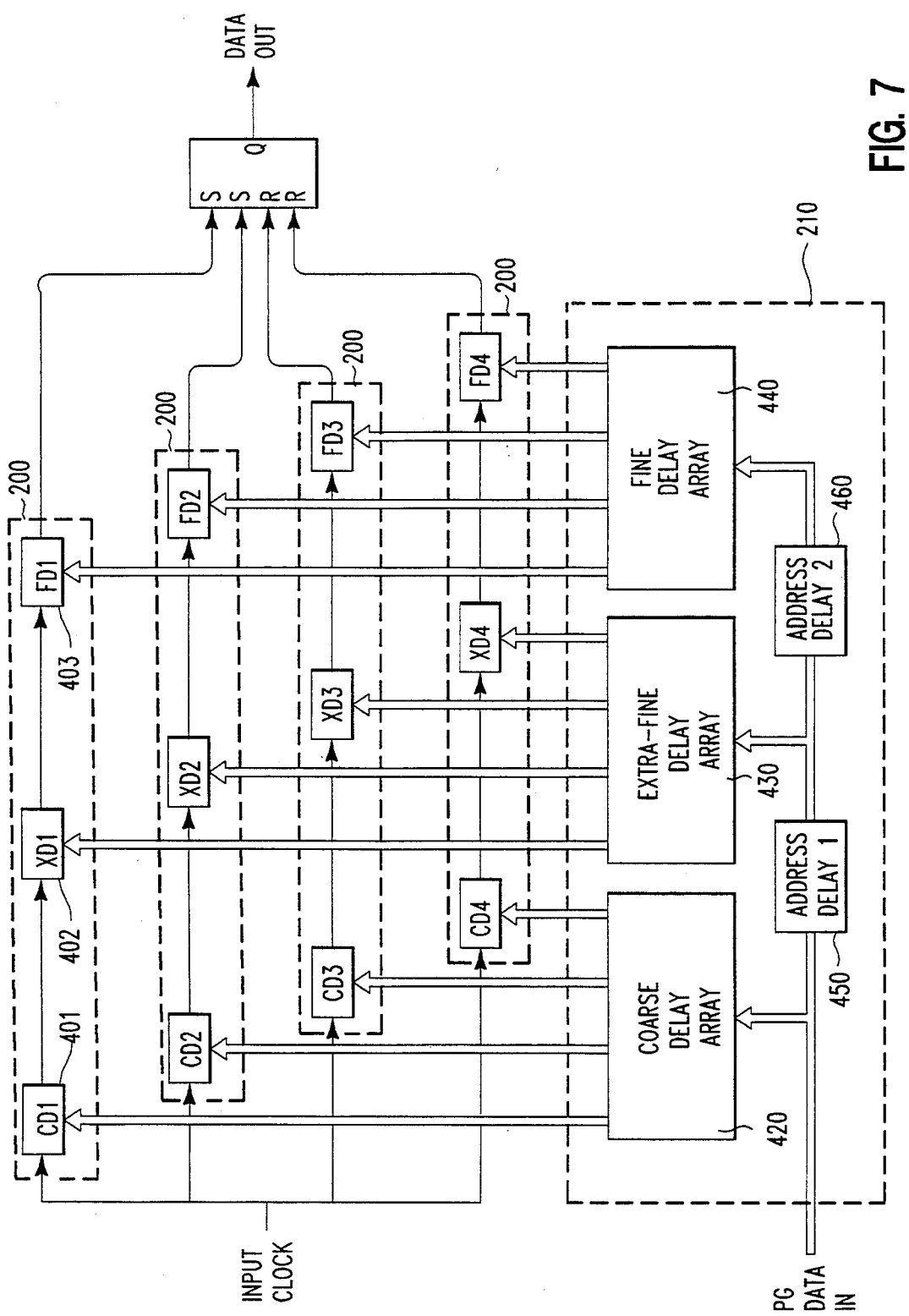
FIG. 7 shows a more detailed schematic diagram of a more detailed programmable pulse generator according with the present invention.

FIG. 7 shows a preferred embodiment of the programmable pulse generator of FIG. 6. Each timing generator 200 combines three types of delay elements to achieve a very linear, high resolution delay range. Each element is, in turn, optimized to produce a linear delay transfer function (obtained by plotting relative propagation delay vs digital input) over the entire delay range and provided with sufficient overlap to compensate for process variations. The three delay elements are:

A coarse delay 401 which uses the cycle time of an input clock as its delay element;

A fine delay 403 which uses the propagation delay of a logic gate as its delay element; and An extra-fine 402 delay which uses digitally controlled gate loading as the delay element.

The latter two elements have been disclosed previously. FIG. 7 shows how they may be combined to provide a high performance pulse generation system. Its operation is summarized in the next three sections.

Coarse Delay

Figure 8:
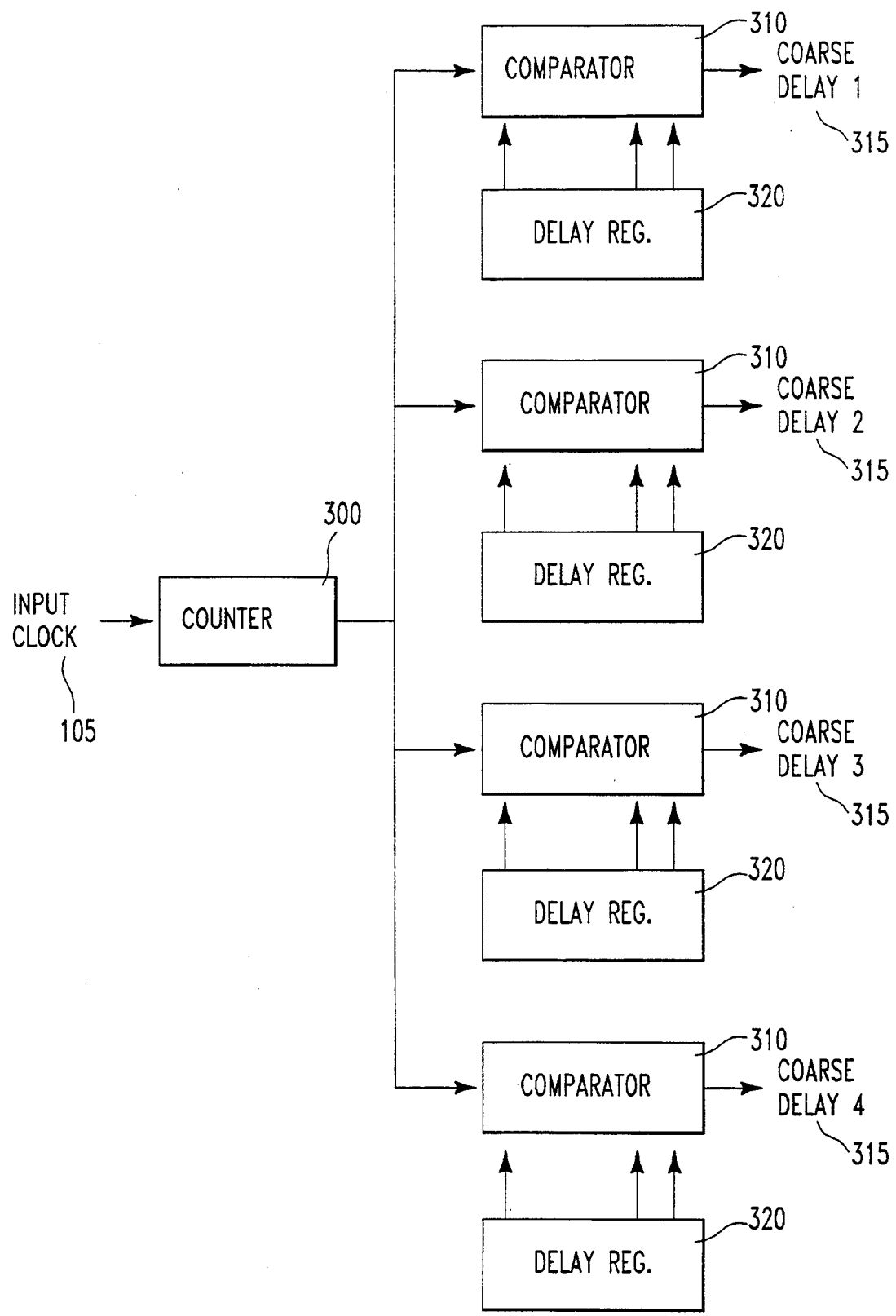
FIG. 8 is a schematic diagram of a 4-output coarse delay circuit, comprising one counter and a plurality of comparators.

FIG. 8 shows a coarse delay circuit provided with one input and four outputs. A counter 300 counts cycles of the input clock 105. A comparator 310 compares the output of the counter with the contents of the appropriate delay register 320 and generates an output pulse (at line 315) whenever there is a match. The pulse is delayed by D cycles of the input clock where D is the value in the delay register. The delay resolution is the period of the input clock. The counter 300 is an N-bit, variable modulus counter which divides the input clock (105) by RR, wherein RR is between 1 and $2^N$. This controls the frequency of the coarse delay output (315). The output frequency or test frequency $f_t$ is given by the following formula:

$$f_t = \frac{f_0}{RR}$$

By varying the input clock frequency $f_0$ and the repetition rate control RR, it is possible to generate any desired output frequency $f_t$. In order to minimize the delay range for the fine delay and extra-fine delay, it is desirable for $f_0$ to be as large as possible. A preferred embodiment uses an 8-bit counter (N=8) and a $f_0$ range of 125 to 250 MHz which is sufficient to generate any cycle time between 2 us and 4 ns. This input frequency range causes the coarse delay resolution to be between 4 ns and 8 ns. Since the output of the counter never exceeds RR-1, one may suppress the generation of an output pulse by programming the desired delay to be D≧RR.

The coarse delay circuit of FIG. 8 preferably comprises a single counter 300 and a plurality of comparators 310, each being controlled by a delay register 320, to produce multiple programmable coarse delays at their respective outputs 315. This reduces the overall size of the coarse delay logic.

Fine Delay

The fine delay circuitry is provided by the programmable delay circuit shown in FIG. 2. The demultiplexer 40 directs the input clock 15 through one or more OR blocks 50, wherein each OR gate is assumed to have the same or approximately the same propagation delay. Thus, a linear delay function is produced.

It is important to note that the fine delay is most advantageously placed as the last element of the complete timing generator structure. This is because the structure of the fine delay allows the delay control bits to change immediately after the clock pulse enters the fine delay input. It is not necessary to wait for the pulse to exit the delay circuit. Since the maximum delay of the fine delay could exceed the tester cycle time (i.e., the rate at which the delay control bits are changed), any other delay elements following the fine delay would make timing-on-the-fly difficult to implement. For this reason, the fine delay is best placed as the last element. Additionally, by placing the fine delay last, it allows pulses to be delayed into the next cycle. As a result, there are no limitations of where the timing pulses may be placed within a given cycle.

If the number of OR blocks 50 is not a power of 2, (i.e., if there are unused demultiplexer outputs) then the output pulses may be suppressed by programming an invalid delay value. By way of example, a 45-step fine delay requires 6 select bits (26=64). Thus, an output pulse may be suppressed by programming a delay number larger than 45.

In a preferred embodiment of this circuit, two NOR-gates for each OR-block are used, for a total of 220 ps per step, thereby minimizing the pulse shrinking effect common to long chains of OR-gates. A single gate delay can be switched into the path at a start of the fine delay to reduce the resolution down to approximately 110 ps. The total range of this Fine Delay is about 10 ns.

Extra Fine Delay

The extra-fine delay operation is described in FIG. 3. As previously described, this circuit uses a digitally controlled gate loading to create an HRPDC capable of producing relative delay steps of less than 10 ps. A programmable delay structure, as shown in FIG. 4, is used to combine a number of these HRPDCs, such that any integer multiple of the HRPDC delay can be obtained. The total range of the extra-fine delay is designed to overlap the minimum step size of the fine delay. In a preferred embodiment, the maximum extra-fine delay range is about 200 ps which is more than sufficient to cover the 110 ps delay of a single OR gate.

Prior to being outputted, a data formatter uses the timing generator outputs to position the rising and falling edges of the output pulse. A typical data formatter is preferably implemented with a set/reset flip-flop.

Timing Control Array

To implement timing-on-the-fly, the desired timing values are stored in an array whose output drives each timing generator 200 (see FIG. 7). For each tester cycle, the pattern generator supplies an array address which is used to select the desired timing values for that cycle.

In the actual implementation of this concept extreme care must be taken not to change the array output at the wrong time; otherwise, timing information may be lost, resulting in incorrect tester outputs. This can be explained by the fact that most (if not all) existing timing generator circuits have an absolute propagation delay greater than the tester cycle time. (The absolute delay is the delay through the circuit when the minimum (zero) relative delay is programmed.) So, it is likely that a timing pulse could still be traveling through the delay generator when the control bits change to the new value. This may give unexpectedly wrong results. A way to solve this problem is by adding delays to compensate for the bulk delay through the timing generator sections. This, generally, can consume considerable IC real estate. In the preferred embodiment, the timing control array is partitioned into a number of smaller arrays (420, 430, and 440)—one array for each major part of the timing generator. The delay elements are added to the address lines for each array (450 and 460). These address delay elements are adjusted to compensate for the absolute delay through each timing generator element. Thus, each of the timing generator element delay control bits will arrive at the proper time—even if the bits from the pattern generator have already changed.

This method is more efficient when the number of array address bits is smaller than the number of delay control bits. In a preferred embodiment, the timing control array has 16 words selected by 4 address bits. Each word contains 20 bits for each timing generator for a total of 80 bits/word. Thus, it is considerably less difficult to add delay to 4 address bits than it is to add it to 80 delay control bits.

Figure 9:
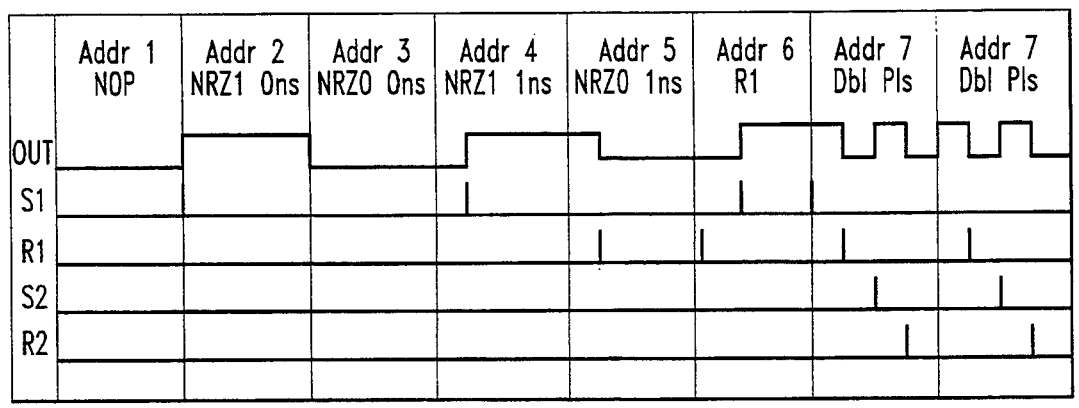
FIG. 9 is a diagram showing possible output waveforms from the programmable pulse generator and which illustrates "timing-on-the-fly" as described in the present invention.

Referring now to FIG. 9, it is shown a plurality of waveforms that are outputted by the programmable pulse generator previously described. The four signals S1, R1, S2, and R2 represent the outputs of the four timing generators. S1 and S2 are used as the Set inputs to the data formatter; they control the position of the output pulses rising edges. R1 and R2 are used as the Reset inputs of the data formatter and control the position of the output pulse falling edge.

TABLE I shows the content of the timing control array for producing these outputs. Each row in the Table corresponds to 1 of the 16 words in the timing control array, wherein each word controls one of the four timing generators. Each timing generator, in turn, may have its output pulse suppressed (shown as OFF) or have a delay value.

The first cycle shown in FIG. 9 illustrates the result of selecting the first array word. (i.e., Address 1). In this case, all four timing generator outputs are suppressed, thus producing no output pulse.

The second cycle illustrates the result of selecting the second array word (i.e., Address 2) in which case, the timing generator S1 produces a pulse at time=0, thereby causing a single rising edge at time=0 at the programmable pulse generator output.

In the third cycle, (i.e., Address 3), the R1 timing generator produces a pulse at time=0, thereby causing a single falling edge at time=0. By alternately selecting words 2 and 3, a typical non-return-to-zero (NRZ) data pattern can be generated. Similarly, words 4 and 5 also produce a NRZ pattern, but at time=1 ns instead. Word 6 shows how a return-to-one (R1) format is produced by selecting two timing generators within the same cycle. Finally, word 7 uses all four timing generators to produce a double pulse format having two pulses within the same cycle.

While only a few illustrative embodiments have been described in detail, it should be apparent to those skilled in the art that there are other variations within the scope of this invention which is more particularly defined in the appended claims.

What is claimed is:

1. A programmable delay circuit, comprising:
    a 1-to-N demultiplexer, wherein N is a positive integer receiving a clock signal with a cycle time, said demultiplexer having N outputs;
    N logic gates connected in series to each other, each of said gates being respectively controlled by one of said N outputs of said demultiplexer; and
    a register having inputs for accepting signals that define a predetermined delay S and outputs that drive said demultiplexer, for propagating said clock signal through at least one of said gates, and for outputting at the last of said N logic gates a signal which is delayed with respect to said clock signal, wherein
    said register is loaded with a new delay after a time interval that is equal to the time required for said clock signal to propagate through said demultiplexer,
        said time interval being less than the cycle time of said clock signal and less than the time required for said clock signal to propagate through all said N logic gates.

2. The circuit as recited in claim 1, wherein the logic gates are OR gates.

3. The circuit as recited in claim 1, wherein each of the logic gates are gated so as to perform an AND function and wherein signals provided by said demultiplexer to be inputted to perform said AND function are inverted.

4. The circuit as recited in claim 1, wherein the programmable delay is:

$$t_{total} = t_{fixed} \times (S+1) t_{block},$$

wherein
- $t_{total}$ is the delay through said programmable delay circuit,
- $t_{fixed}$ is the delay through said demultiplexer,
- $t_{block}$ is the delay through one of said logic gates, and
- $S$ is a number representing said predetermined delay.

5. A high resolution programmable delay circuit (HRPDC) having a delay which is at least an order of magnitude lower than the delay of a logic gate, and which provides timing-on-the-fly capabilities, comprising:
- a first logic gate having an input for receiving a signal provided by a clock having a clock cycle time and an output;
- a second logic gate having an input connected to the output of the first logic gate and an output for provided a signal which is delayed with respect to the signal provided by the clock;
- means for loading connected to the output of the first logic gate comprising at least one loading block, each of said at least one loading blocks having a loading input and a control input, wherein the loading input is connected to the output of the first logic gate, the control input provides a control signal which determines the amount of loading on said first logic gate, thereby controlling the amount of delay by which a signal outputted at the output of said second logic gate is delayed with respect with respect to the signal provided by the clock, and wherein
- said control input provides a new control signal after a time interval which is equal to the cycle time of the clock, said cycle time being greater or equal than the time required for said clock signal to propagate through said first and second logic gates.

6. The high resolution programmable delay circuit as recited in claim 5, wherein each of said loading blocks comprises a current switch emitter follower logic gate having a plurality of inputs and one output, one of said inputs is the control input of said loading block, and the remaining of said plurality of inputs are connected to each other to form the loading input of said loading block, and the output of said current switch emitter follower logic gate remains unused.

7. A compounded high resolution programmable delay circuit having a clock input, a control input and an output, said compounded high resolution programmable delay circuit comprising:
- a plurality of high resolution programmable delay circuits (HRPDCs), wherein each of said HRPDCs has an output, a clock input to provide a clock signal having a cycle time, a control input providing a control signal that controls the amount of delay by which a signal is outputted at said output, wherein said outputted signal is delayed with respect to said clock signal, said HRPDCs are connected to each other in series by connecting the output of one of said HRPDCs to the clock input of the next HRPDC, and wherein each of the control inputs of each of said HRPDCs are connected to each other to form the control input of the compounded circuit, and wherein
- said control input of said compounded circuit provides a new control signal after a time interval which is equal to the cycle time of the clock, said cycle time being greater than or equal to the time required for said clock signal to propagate through said plurality of HRPDCs.

8. A compounded high resolution programmable delay circuit having a clock input, a control input and an output, said compounded high resolution programmable delay circuit comprising:
- a plurality of high resolution programmable delay circuits (HRPDCs), wherein each of said HRPDCs has an output, a clock input to provide a clock signal having a cycle time, a control input providing a control signal that controls the amount of delay by which a signal is outputted at said output, wherein said outputted signal is delayed with respect to said clock signal,
- said HRPDCs are connected to each other in series by connecting the output of one of said HRPDCs to the clock input of the next HRPDC; and
- a plurality of delay blocks, wherein the number of said delay blocks is one less than the number of HRPDCs, each of said delay blocks having an input and an output
- said delay blocks are inserted between the control inputs of said HRPDCs by connecting the input of one of said delay blocks to the control input of one of said HRPDCs, and the output of said one of the delay blocks to the control input of the next of said HRPDCs,
- the input of the first of said delay blocks is the control input of the compounded HRPDC, thereby
- moving the control signal in step with the clock signal, and wherein
- said control input of the compounded HRPDC provides a new control signal after a time interval which is equal to the cycle time of the clock, said cycle time being less than the time required for said clock signal to propagate through said plurality of HRPDCs.

9. A programmable delay structure, comprising:
- N compounded HRPDCs, each of said compounded HRPDCs having a clock input, a control input and an output, wherein N being a positive integer,
- said compounded HRPDCs are connected to each other in series by connecting the output of one of said compounded HRPDC to the clock input of the next compounded HRPDC, wherein
- the first of said compounded HRPDCs includes $2^0$ HRPDCs, the second includes $2^1$ HRPDCs, and the Nth of said compounded HRPDCs includes $2^{N-1}$ HRPDCs, and wherein
- the delay through the programmable delay structure is:

$$t_{total} = t_{fixed} + D \times t_{HRPDC}$$

in which
- $t_{total}$ is the delay through the structure,
- $t_{fixed}$ is the minimum delay through all the HRPDCs, and
- $t_{HRPDC}$ is the difference between the delay through the HRPDC when the control input of said HRPDC is in a predetermined binary state and the delay through said HRPDC when the control input is in the opposite binary state, and D is a number that corresponds to the number of HRPDCs which are in an active state.

10. The programmable delay structure as recited in claim 9, wherein each of said HRPDCs has a control input, and wherein the predetermined binary state of the first of said HRPDCs is determined by setting its control input to 0.

11. The programmable delay structure as recited in claim 9, further comprising N−1 delay blocks Dly, each having an input and an output, wherein the input provides signals that specify a predetermined delay, and the output at the mth block is attached to said control input of the (m+1)th of said compounded HRPDCs to align the signals at said clock inputs with said control inputs of said compounded HRPDCs, wherein m is a positive integer ranging from 1 to N−1, and the delay of the mth block is:

$$Dly_m = t_D \times (2^m - 1)$$

wherein $t_D$ is the delay through one of said HRPDCs.

12. A programmable pulse generator for providing a linear, high resolution delay over a wide range of delays, for providing delay overlap, and for shaping an output pulse with edges of predefined shape, comprising:

a timing control array having a plurality of inputs and outputs, each input is connected to a respective data line for selecting a predetermined delay to be generated, said array having address lines for determining an address;

N timing generators, N being a positive number, each of said N timing generators having a clock input driven by clocking means, a plurality of control input lines connected to the outputs of said timing control array and an output to provide a signal which is delayed with respect to said clock input signal; and a data formatter having N inputs and an output, wherein each of said inputs is respectively driven by one of said N timing generators outputs, and wherein each of said inputs controls the position of a signal's rising or falling edge at said output, said data formatter combines signals at said N inputs into pulses having rising and falling edges that are delayed with respect to said input clock signal.

13. The programmable pulse generator as recited in claim 12, further comprising a timing control array that is partitioned into three arrays to provide coarse delay provided by a coarse generator, fine delay provided by a programmable delay circuit and extra-fine delay provided by a programmable delay structure, each of said arrays driving its own separate set of said timing control generators.

14. The programmable pulse generator as recited in claim 13, wherein each of said timing control generators further comprises:

a coarse delay generator that drives a programmable delay structure, said structure drives a programmable delay circuit, and wherein said coarse delay generator is provided with plural control inputs that are connected to the outputs of said coarse delay array;

said programmable delay structure is provided with plural control inputs connected to the outputs of said extra fine array; and said programmable delay circuit is provided with plural control inputs connected to the outputs of said fine delay array and which output is connected to a data formatter.

15. The programmable pulse generator of claim 14, further comprising:

a first address delay block having inputs connected to said address lines of said coarse timing control array and outputs connected to said address lines of said extra fine timing control array, said first address delay block delaying each of said address lines by a time interval which is equal to the minimum delay through said coarse delay generator, thereby aligning said extra fine timing control array outputs with said programmable delay structure clock inputs, and a second address delay block having inputs connected to said address lines of said extra fine timing control array and outputs connected to said address lines of said fine timing control array, said second address delay block delaying each of said address lines by a time interval which is equal to the minimum delay through said extra fine delay generator, thereby aligning said fine timing control array outputs with said programmable delay circuit clock inputs, thereby permitting timing-on-the-fly capabilities.

16. A high resolution programmable delay circuit having a delay which is at least an order of magnitude lower than the delay of a logic gate, and which provides timing-on-the-fly capabilities, comprising:

a logic gate having an input for receiving a signal provided by a clock having a clock cycle time and one output for providing a signal which is delayed with respect to the clock signal;

means for loading connected to the output of the logic gate comprising at least one loading block, each of said at least one loading blocks having:

a loading input and a control input, the loading input is connected to the output of the logic gate, the control input provides a control signal which determines the amount of loading on said logic gate, thereby controlling the amount of delay by which a signal outputted at the output of said logic gate is delayed with respect of the signal provided by the clock, and wherein said control input provides a new control signal after a time interval which is equal to the cycle time of the clock, said cycle time being greater than or equal to the time required for said clock signal to propagate through said logic gate.

17. The high resolution programmable delay circuit as recited in claim 16, wherein each of said loading blocks comprises a current switch emitter follower circuit having a plurality of inputs, one of said inputs is the control input and the remaining of said plurality of inputs are connected to each other to form the loading input.

* * * * *